United States Patent [19]
Kinouchi et al.

[11] Patent Number: 5,617,089
[45] Date of Patent: Apr. 1, 1997

[54] HUFFMAN CODE DECODING CIRCUIT

[75] Inventors: Shigenori Kinouchi; Akira Sawada, both of Tokyo, Japan

[73] Assignee: NEC Corporation, Japan

[21] Appl. No.: 399,752

[22] Filed: Mar. 7, 1995

[30] Foreign Application Priority Data

Mar. 9, 1994 [JP] Japan .................................. 6-064422

[51] Int. Cl.$^6$ ...................................................... H03M 7/40
[52] U.S. Cl. ................... 341/65; 341/67; 341/63
[58] Field of Search .................. 341/65–67, 63, 341/106

[56] References Cited

U.S. PATENT DOCUMENTS

| | | | |
|---|---|---|---|
| 5,398,027 | 3/1995 | Ooi | 31/67 |
| 5,404,138 | 4/1995 | Kim et al. | 341/67 |
| 5,428,356 | 6/1995 | Ozaki | 341/67 |
| 5,446,916 | 8/1995 | Derovanessian | 395/800 |
| 5,467,088 | 11/1995 | Kinoochi et al. | 341/65 |

Primary Examiner—Jeffrey A. Gaffin
Assistant Examiner—Peguy JeanPierre
Attorney, Agent, or Firm—Ostrolenk, Faber, Gerb & Soffen, LLP

[57] ABSTRACT

A Huffman code decoding circuit including a leading bit position determination unit for determining a leading bit position of a Huffman code to be taken out of a Huffman code data sequence to take in a predetermined number of bits from the leading bit position of the Huffman code data sequence, a first decoding table for inputting a first data sequence composed of a predetermined number of bits staring with the leading bit of the Huffman code data sequence output from the leading bit position determination unit to output a first decoded word and a first code length corresponding to the first data sequence input as an address, a plurality of 2nd to n-th decoding tables for inputting 2nd to n-th data sequences composed of a predetermined number of bits starting at a different bit position of the Huffman code data sequence output from the leading bit position determination unit to output a decoded word and a code length corresponding to the 2nd to n-th data sequences input as addresses, and a selector for selecting one of the outputs of the 2nd to n-th decoding tables in response to the first code length output from the first decoding table as a select signal to output a second decoded word and a second code length.

12 Claims, 11 Drawing Sheets

FIG. 2

DECODING TABLE 12

| INPUT (ADDRESS) | | | | | | | | | | | | | | | | OUTPUT |
| 15 | 14 | 13 | 12 | 11 | 10 | 9 | 8 | 7 | 6 | 5 | 4 | 3 | 2 | 1 | 0 | |
| --- | --- | --- | --- | --- | --- | --- | --- | --- | --- | --- | --- | --- | --- | --- | --- | --- |
| 0 | 1 | 0 | 1 | x | x | x | x | x | x | x | x | x | x | x | x | DECODED WORD=A, CODE LENGTH=4 |
| 0 | 1 | 1 | 0 | 1 | 0 | 1 | x | x | x | x | x | x | x | x | x | DECODED WORD=B, CODE LENGTH=7 |
| ... | ... | ... | ... | ... | ... | ... | ... | ... | ... | ... | ... | ... | ... | ... | ... | ... |

FIG. 3

DECODING TABLE 13

| INPUT (ADDRESS) | | | | | | | | | | | | | | | | OUTPUT |
| 15 | 14 | 13 | 12 | 11 | 10 | 9 | 8 | 7 | 6 | 5 | 4 | 3 | 2 | 1 | 0 | |
| --- | --- | --- | --- | --- | --- | --- | --- | --- | --- | --- | --- | --- | --- | --- | --- | --- |
| 0 | 1 | 0 | 1 | x | x | x | x | x | x | x | x | x | x | x | x | DECODED WORD=A, SUM OF CODE LENGTH=5 |
| 0 | 1 | 1 | 0 | 1 | 0 | 1 | x | x | x | x | x | x | x | x | x | DECODED WORD=B, SUM OF CODE LENGTH=8 |
| ... | ... | ... | ... | ... | ... | ... | ... | ... | ... | ... | ... | ... | ... | ... | ... | ... |

FIG. 4

DECODING TABLE 16

| \multicolumn{16}{c|}{INPUT (ADDRESS)} | OUTPUT |
| 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|
| 0 | 1 | 0 | 1 | X | X | X | X | X | X | X | X | X | X | X | X | DECODED WORD=A, SUM OF CODE LENGTH=8 |
| 0 | 1 | 1 | 0 | 1 | 0 | 1 | X | X | X | X | X | X | X | X | X | DECODED WORD=B, SUM OF CODE LENGTH=11 |
| ... | ... | ... | ... | ... | ... | ... | ... | ... | ... | ... | ... | ... | ... | ... | ... | ... |

FIG. 5

DECODING TABLE 23

| \multicolumn{16}{c|}{INPUT (ADDRESS)} | OUTPUT |
| 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|
| 0 | 1 | 0 | 1 | X | X | X | X | X | X | X | X | X | X | X | X | DECODED WORD=A, SUM OF CODE LENGTH=15 |
| 0 | 1 | 1 | 0 | 1 | 0 | 1 | X | X | X | X | X | X | X | X | X | DECODED WORD=B, SUM OF CODE LENGTH=18 |
| ... | ... | ... | ... | ... | ... | ... | ... | ... | ... | ... | ... | ... | ... | ... | ... | ... |

FIG. 8

DECODING TABLE 72

| 15 | 14 | 13 | 12 | 11 | 10 | 9 | 8 | 7 | 6 | 5 | 4 | 3 | 2 | 1 | 0 | OUTPUT |
|---|---|---|---|---|---|---|---|---|---|---|---|---|---|---|---|---|
| 0 | 1 | 1 | 1 | x | x | x | x | x | x | x | x | x | x | x | x | DECODED WORD=A, CODE LENGTH=4 |
| 0 | 1 | 0 | 1 | 1 | 1 | 1 | x | x | x | x | x | x | x | x | x | DECODED WORD=B, CODE LENGTH=7 |
| 0 | 1 | 0 | 1 | 1 | 1 | 0 | 0 | 0 | 0 | 0 | 0 | 1 | x | x | x | DECODED WORD=C, CODE LENGTH=13 |
| 1 | 0 | 1 | 1 | 0 | 0 | 0 | 0 | 0 | 1 | x | x | x | x | x | x | DECODED WORD=D, CODE LENGTH=10 |
| ... | ... | ... | ... | ... | ... | ... | ... | ... | ... | ... | ... | ... | ... | ... | ... | ... |

INPUT (ADDRESS)

FIG. 9

DECODING TABLE 73

| 14 | 13 | 12 | 11 | 10 | 9 | 8 | 7 | 6 | 5 | 4 | 3 | 2 | 1 | 0 | OUTPUT | FLAG |
|---|---|---|---|---|---|---|---|---|---|---|---|---|---|---|---|---|
| 0 | 1 | 1 | 1 | x | x | x | x | x | x | x | x | x | x | x | DECODED WORD=A, SUM OF CODE LENGTH=5 | 0 |
| 0 | 1 | 0 | 1 | 1 | 1 | 1 | x | x | x | x | x | x | x | x | DECODED WORD=B, SUM OF CODE LENGTH=8 | 0 |
| 0 | 1 | 0 | 1 | 1 | 1 | 0 | 0 | 0 | 0 | 0 | 0 | 1 | x | x | DECODED WORD=C, SUM OF CODE LENGTH=14 | 0 |
| 1 | 0 | 1 | 1 | 0 | 0 | 0 | 0 | 0 | 1 | x | x | x | x | x | DECODED WORD=D, SUM OF CODE LENGTH=11 | 0 |
| ... | ... | ... | ... | ... | ... | ... | ... | ... | ... | ... | ... | ... | ... | ... | ... | ... |
| | | | | | | | | | | | | | | | CODE LENGTH=1 | 1 |

INPUT (ADDRESS)

IN A CASE WHERE A PART OF HUFFMAN CODE IS INPUT AS ADDRESS

FIG. 10

DECODING TABLE 76

| INPUT (ADDRESS) | | | | | | | | | | | | OUTPUT | FLAG |
|---|---|---|---|---|---|---|---|---|---|---|---|---|---|
| 11 | 10 | 9 | 8 | 7 | 6 | 5 | 4 | 3 | 2 | 1 | 0 | | |
| 0 | 1 | 0 | 1 | x | x | x | x | x | x | x | x | DECODED WORD=A, SUM OF CODE LENGTH=8 | 0 |
| 0 | 1 | 1 | 0 | 1 | 0 | x | x | x | x | x | x | DECODED WORD=B, SUM OF CODE LENGTH=11 | 0 |
| 0 | 1 | 1 | 1 | 0 | 1 | 1 | 0 | 0 | 1 | 0 | 0 | CODE LENGTH=4 | 1 |
| 1 | 0 | 1 | 1 | 1 | 0 | 1 | 0 | 0 | 0 | x | x | DECODED WORD=D, SUM OF CODE LENGTH=14 | 0 |
| ... | ... | ... | ... | ... | ... | ... | ... | ... | ... | ... | ... | ... | ... |
| IN A CASE WHERE A PART OF HUFFMAN CODE IS INPUT AS ADDRESS | | | | | | | | | | | | CODE LENGTH=4 | 1 |

FIG. 11

DECODING TABLE 85

| INPUT (ADDRESS) | | | OUTPUT | FLAG |
|---|---|---|---|---|
| 2 | 1 | 0 | | |
| 0 | 1 | 0 | CODE LENGTH=13 | 1 |
| 0 | 1 | 1 | | 1 |
| 1 | 0 | 1 | | 1 |
| ... | ... | ... | ... | ... |
| IN A CASE WHERE A PART OF HUFFMAN CODE IS INPUT AS ADDRESS | | | CODE LENGTH=13 | 1 |

FIG. 16 (PRIOR ART)

DECODING TABLE 501

| 15 | 14 | 13 | 12 | 11 | 10 | 9 | 8 | 7 | 6 | 5 | 4 | 3 | 2 | 1 | 0 | OUTPUT |
|---|---|---|---|---|---|---|---|---|---|---|---|---|---|---|---|---|
| 0 | 1 | 0 | 1 | X | X | X | X | X | X | X | X | X | X | X | X | DECODED WORD=A, CODE LENGTH=4 |
| 0 | 1 | 1 | 0 | 1 | 0 | 1 | X | X | X | X | X | X | X | X | X | DECODED WORD=B, CODE LENGTH=7 |
| ... | ... | ... | ... | ... | ... | ... | ... | ... | ... | ... | ... | ... | ... | ... | ... | ... |

FIG. 17 (PRIOR ART)

DECODING TABLE 602

| 15 | 14 | 13 | 12 | 11 | 10 | 9 | 8 | 7 | 6 | 5 | 4 | 3 | 2 | 1 | 0 | OUTPUT |
|---|---|---|---|---|---|---|---|---|---|---|---|---|---|---|---|---|
| 0 | 1 | 0 | 1 | X | X | X | X | X | X | X | X | X | X | X | X | DECODED WORD=A, CODE LENGTH=4 |
| 0 | 1 | 1 | 0 | 1 | 0 | 1 | X | X | X | X | X | X | X | X | X | DECODED WORD=B, CODE LENGTH=7 |
| 0 | 1 | 1 | 1 | 0 | 0 | 1 | 0 | 1 | 1 | 0 | 0 | 1 | X | X | X | DECODED WORD=C, CODE LENGTH=13 |
| 1 | 0 | 1 | 1 | 0 | 1 | 0 | 0 | 0 | 0 | 0 | X | X | X | X | X | DECODED WORD=D, CODE LENGTH=10 |
| ... | ... | ... | ... | ... | ... | ... | ... | ... | ... | ... | ... | ... | ... | ... | ... | ... |

…

HUFFMAN CODE DECODING CIRCUIT

BACKGROUND OF THE INVENTION

1. Field of the Invention

The present invention relates to a Huffman code decoding circuit for decoding a Huffman code, and more particularly, to a Huffman code decoding circuit capable of executing high-speed Huffman code decoding processing.

2. Description of the Related Art

In conventional decoding of Huffman codes, decoded words are obtained word by word. When in obtaining two decoded words at a time, two decoding tables are prepared and searched to find two decoded words each from an input Huffman code. Then, by adding code lengths of the two decoded words, a leading bit of a next Huffman code to be obtained is determined out of a Huffman code data sequence.

The principle of Huffman codes will be described in brief.

(1) Form a leaf corresponding to each letter.

(2) Form a new nodal point for two leaves whose occurrence probability is the lowest and link the nodal point to the two leaves by two branches.

(3) Label one of the two branches as "0" and the other as "1" and provide the new nodal point with a sum of the probabilities of the two leaves.

(4) With the new nodal point as a new leaf (removing the branches and the leaves reaching out from the nodal point and assuming the nodal point as a leaf), repeat the above operations (2) and (3) until only one leaf is left. Take the last leaf as a root.

Then, a series of "1" and "0" obtained as a result of the tracing of the branches from the root to the leaf corresponding to the letter will represent a code word of the letter (see FIG. 15). In FIG. 15, for example, a code word of the letter "a" whose occurrence probability is 1/12 and a code word of the letter "d" whose occurrence probability is 1/6 are "1111" (code length is 4) and "100" (code length is 3), respectively. Processing for decoding coded data into an original letter is referred to as decoding.

FIG. 13 is a block diagram showing an example of a conventional arrangement of a Huffman code decoding circuit for decoding Huffman codes by obtaining decoded words one by one (referred to as first conventional art). Herein, the maximum code length of a Huffman code is assumed to be 16 bits. In the figure, the Huffman code data sequence "15-0" represents 16 bits of a Huffman code data sequence, and the bit number "15", which is the most significant bit (MSB), is taken as a leading bit.

As shown in FIG. 13, the Huffman code decoding circuit comprises a top, determination unit 500 for obtaining a leading bit of a Huffman code out of a Huffman code data sequence and a decoding table 501 where decoded words and codelengths are stored beforehand. The decoding table 501 includes a ROM (Read Only Memory) etc.

The decoding table 501, as shown in FIG. 16, stores a decoded word of 8 bits and a code length of 5 bits corresponding to a Huffman code applied as an address. For example, a Huffman code for a decoded word "A" is set to be "0101" and that for a decoded word "B" is set to be "0110101". When a Huffman code data sequence "0101x . . . " is input as an address, the decoded word "A" and the code length "4" are output from the decoding table 501, and when a Huffman code data sequence "0110101x . . . " is input as an address, the decoded word "B" and the code length "7" are output from the decoding table 501.

In the decoding table 501 decoded words and code lengths are set corresponding to inputs of the other Huffman codes (address input) in the same manner. The symbol "x" shown in an input bit sequence in FIG. 16 is indicative of a logical value of either "0" or "1" (do not care). Accordingly, when a Huffman code corresponding to the decoded word "A" is "0101", the decoded word "A" and the code length "4" are set for all of 16-bit addresses "01010 . . . 0" to "01011 . . . 1". An initial value of the top determination unit 500 is set to be a leading bit of the 16 bits of an applied Huffman code data sequence.

In FIG. 13, assuming that a Huffman code data sequence "01010110101001 . . . " arrives, the top determination unit 500 receives 16 bits from the top, that is, "01010110101001 . . . "

The top determination unit 500, in which the initial value of a leading bit position corresponds to a leading bit of 16 bits of an applied Huffman code data sequence, sends 16 bits from the top, i.e. "01010110101001 . . . ", to the decoding table 501.

The decoding table 501, which is set to output the decoded word "A" and the code length "4" in response to an input of "0101x . . . ", outputs the decoded word "A" and the code length "4". Then, the obtained coded length "4" is sent to the top determination unit 500.

Based on the applied code length "4", the top determination unit 500 finds that a leading bit of the next Huffman code data sequence corresponds to the 5th bit of the 16-bit data "01010110101001 . . . " Then, 16 bits from the leading bit which is newly obtained by the top determination unit 500, that is, "0110101001 . . . ", are input to the decoding table 501.

The decoding table 501, which is set to output the decoded word "B" and the code length "7" in response to an input of "0110101x . . . ", outputs the decoded word "B" and the code length "7" for the applied "0110101001 . . . " The code length "7" is sent to the top determination unit 500.

Based on the applied code length "7", the top determination unit 500 finds that a leading bit of the next Huffman code data sequence corresponds to the 8th bit of the 16-bit data "0110101001 . . . " Then, 16 bits from the leading bit which is newly obtained by the top determination unit 500, that is, "001 . . . 1", are input to the decoding table 501. Operation will be further repeated in the same manner to execute decoding of coded data.

As a variation of the first conventional art for obtaining decoded words one by one, Japanese Patent Laying Open No. 62-66720, for example, recites a variable-length decoding circuit which requires reduced time for decoding variable-length codes. In order to realize high-speed decoding of variable-length codes within a predetermined time (step ?) irrespective of a code length, the variable-length decoding circuit is structured to decode coded data in each step while reading a code length at the same time and sequentially and controllably input coded data corresponding to an obtained bit position to a decoding table.

More specifically, the variable-length decoding circuit disclosed in Japanese Patent Laying Open No. 62-66720 (referred to as second conventional art) comprises a data register, a code register, address selectors, a leading bit number register, a control circuit and a ROM as a decoding table. 8-bit parallel data output from the code register are applied to corresponding 8 address selectors. Each address selector receives data whose bit order is shifted bit by bit and also receives a bit order selection signal sent from the leading bit number register as a select signal of the address selector. Each address selector outputs a bit in a designated order as 1-bit data to the decoding table (ROM), which table further outputs a decoded word and a code length.

FIG. 14 is a block diagram showing an arrangement example of a conventional Huffman code decoding circuit for decoding Huffman codes by obtaining two decoded words at a time (third conventional art). In FIG. 14, the maximum code length of a Huffman code is set to be 16 bits. In the figure, the Huffman code data sequence "31-0" represents 32 bits of a Huffman code data sequence and the 31st bit, that is, the most significant bit, is taken as a leading bit.

The Huffman code decoding circuit shown in FIG. 14 comprises top determination units 600 and 601 for determining the top of a Huffman code out of a Huffman code data sequence, decoding tables 602 and 603 where a decoded word of 8 bits, a code length of 5 bits and a flag of 1 bit are stored, adders 604 and 605 and a pointer 606.

As illustrated in FIG. 17, the decoding tables 602 and 603 store a decoded word of 8 bits, a code length of 5 bits and a flag of 1 bit corresponding to an input of a Huffman code (address).

Set, for example, are a Huffman code "0101" for a decoded word "A", "0110101" for a decoded word "B", "0111001011001" for a decoded word "C" and "1011010000" for a decoded word "D". The decoding tables 602 and 603 accordingly output the decoded word "A", the code length "4" and the flag "0" in response to an input of "0101x" the decoded word "B", the code length "7" and the flag "0" to an input of "0110101x . . .", the decoded word "C", the code length "13" and the flag "0" to "0111001011001x . . .", and the decoded word "D", the code length "10" and the flag "0" to "1011010000x . . ."

The decoding tables 602 and 603 are also set to output the code length "0" and the flag "1" in response to an input of a part of a Huffman code corresponding to a decoded word as an address. More specifically, when a part of "1011010000" indicative of the decoded word "D", for example, 8-bit data "10110100", is input as an address, the decoding tables 602 and 603 output the code length "0" and the flag "1".

In the same manner, the decoding tables 602 and 603 store a decoded word, a code length and a flag corresponding to each address input beforehand.

The initial value of the top determination unit 600 is set to be a leading bit of an applied Huffman code data sequence. On receiving an input of the flag "1", the top determination unit 600 outputs 32 bits from the top of a newly obtained Huffman code. The initial value of the pointer 606 is set to be 0.

It is assumed that a Huffman code data sequence "010101101010111001011001101101000001101101 . . ." is sent to the Huffman decoding circuit of FIG. 14.

The top determination unit 600 receives an input of 32 bits from the top, i.e. "01010110101011100101100110110100". The top determination unit 600, whose initial value is set to be a leading bit of an input Huffman code data sequence, outputs 32 bits from the top, "01010110101011100101100110110100". The output 32-bit data is input to the top determination unit 601.

The decoding table 602 receives an input of the higher 16 bits "0101011010101110" of the above-described 32-bit data. The decoding table 602, which is set to output the decoded word "A", the code length "4" and the flag "0" in response to an input of "0101x . . .", outputs the decoded word "A", the code length "4" and the flag "0". The code length "4" is sent to the top determination unit 601 and the adder 604.

Based on the code length "4" sent from the decoding table 602, the top determination unit 601 finds that the top of the next Huffman code data sequence corresponds to the 5th bit of the 32-bit data "01010110101011100101100110110100", and applies 16 bits starting at the 5th bit position from the top, that is, "0110101011100101", to the decoding table 603.

The decoding table 603, which is set to output the decoded word "B", the code length "7" and the flag "0" in response to an input of "0110101x . . .", outputs the decoded word "B", the code length "7" and the flag "0". The code length "7" is sent to the adder 604.

In the adder 604, the code length "7", which is the output of the decoding table 603, is added to the code length "4" of the decoded word "A" output from the decoding table 602. The output (4+7=11) of the adder 604 is sent to the adder 605. In the adder 605, the output of the adder 604 and that of the pointer 606 are added. In this case, since the output of the pointer 606 is the initial value "0", 11 (11+0=11) is sent from the adder 605 to the pointer 606.

The output (=11) from the pointer 606 is applied to the top determination unit 600. The top determination unit 600 finds that a leading bit of the next Huffman code corresponds to the 12th bit of the 32-bit data "01010110101011100101100110110100", and applies 16 bits starting at the 12th bit position from the top, i.e. "0111001011001101", to the decoding table 602.

On the other hand, the top determination unit 601 receives an input of 12th to 32th bits from the top, that is, 21-bit data "011100101100110110100".

The decoding table 602, which is set to output the decoded word "C", the code length "13" and the flag "0" in response to an input of "0111001011001x . . .", outputs the decoded word "C", the code length "13" and the flag "0". The code length "13" is sent to the top determination unit 601 and the adder 604.

Based on the code length "13", which is the output of the decoding table 602, the top determination unit 601 finds that the position of a leading bit of the next Huffman code data sequence corresponds to the 14th bit from the top of the 21-bit data "011100101100110110100", and applies the 8 bits from the 14th to the 21th bit position from the top, i.e. "10110100", to the decoding table 603.

The decoding table 603, which is set as described above to output the code length "0" and the flag "1" in response to an input of 8-bit data "10110100" (a part of "1011010000" indicative of the decoded word "D"), sends the code length "0" to the adder 604 and the flag "1" to the top determination unit 600.

The adder 604 adds the code length "13" of the decoded word "C" and the code length "0" and sends the sum of 13 (=13+0) to the adder 605. The adder 605 adds the output (=11) of the pointer 606 and the output (=13) of the adder 605 and sends the sum of 24 (=11+13) to the pointer 606.

The output (=24) from the pointer 606 is applied to the top determination unit 600. The top determination unit 600 finds that a leading bit of the next Huffman code corresponds to the 25th bit of the 32-bit data "01010110101011100101100110110100".

On the other hand, on receiving the flag "1" and determining that a code length of the Huffman code to be obtained is larger than 8 bits, the top determination unit 600 outputs, as new 32-bit data, 8-bit data "10110100", which are 25th to 32th bits of the 32-bit data "01010110101011100101100110110100", in combination with 24 bits of the next Huffman code data sequence.

With the flag "1", the decoding table 603, for example, may ignore the output of 8-bit decoded word data, using the flag as an enable signal. The above-described processing will be repeated hereinafter to sequentially decode a Huffman code data sequence.

In the first and second conventional art, in which decoded words are obtained one by one, however, the above-described Huffman code decoding circuits require longer processing time to prevent reduction of decoding processing.

On the other hand, the third conventional art, in which the Huffman code decoding circuit is structured to obtain two decoded words at a time, requires a longer pass (signal path) because code length data and the like are to be transmitted from the top determination unit 600 through the decoding table 602, the top determination unit 601, the decoding table 603, the adder 604, the adder 605 and the pointer 606 back to the top determination unit 600 for processing. Therefore, while decoding processing can be executed at a speed higher than that in obtaining a decoded word one by one, a processing speed will be sacrificed by a longer pass (signal path). In other words, it is difficult to improve a processing speed by increasing an operating frequency because a longer pass (signal path) is required.

SUMMARY OF THE INVENTION

A first object of the present invention is to provide a Huffman code decoding circuit which realizes high-speed Huffman code decoding processing by obtaining two decoded words at a time.

A second object of the present invention is to provide a Huffman code decoding circuit which realizes high-speed decoding processing by using a reduced circuit pass (signal path).

A third object of the present invention is to provide a Huffman code decoding circuit structured to achieve high-speed processing for coding while minimizing an increase in the scale of a circuit.

According to one aspect of the invention, a Huffman code decoding circuit comprises:

leading bit position determination means for determining a leading bit position of a Huffman code to be taken out of a Huffman code data sequence to take in a given number of bits starting at said determined leading bit position of said Huffman code data sequence;

first decoding information storage means for inputting a first data sequence composed of a predetermined number of bits starting with the leading bit of said Huffman code data sequence output from said leading bit position determination means to output a first decoded word panda first code length corresponding to said first data sequence applied as an address;

a plurality of 2nd to n-th decoding information storage means for respectively inputting 2nd to n-th data sequences each composed of a predetermined number of bits starting at a different bit position different of said Huffman code data sequence output from said leading bit position determination means to output a decoded word and a code length corresponding to the 2nd to n-th data sequences applied as addresses; and selection means for selecting one of the outputs of said 2nd to n-th decoding information storage means in response to the first code length output by said first decoding information storage means as a select signal to output a second decoded word and a second code length;

wherein said second code length output from said selection means is supplied to said leading bit position determination means and said leading bit position determination means determines a leading bit position of a Huffman code data sequence to be taken in based on said second code length.

In the preferred construction, the 2nd to n-th decoding information storage means store a sum of a code length of the second decoded word and said first code length as said second code length.

Also, the 1st to n-th data sequences input to said 1st to n-th decoding information storage means are of the same number of bits.

In the above-mentioned construction, the 2nd to n-th decoding information storage means for outputting the second decoded word and the second code length respectively receive inputs of said 2nd to n-th data sequences whose leading bit corresponds to a bit position shifted bit by bit in said Huffman code data sequence output from said leading bit position determination means.

In the above-mentioned construction, the 1st to n-th data sequences input to said 1st to n-th decoding information storage means are of the same number of bits, and said 2nd to n-th decoding information storage means for outputting the second decoded word and the second code length respectively receive inputs of said 2nd to n-th data sequences whose leading bit corresponds to a bit position shifted bit by bit from the leading bit position of said Huffman code data sequence output from said leading bit position determination means.

Also, the said 1st to n-th data sequences input to said 1st to n-th decoding information storage means are of the same number of bits, and said 2nd to n-th decoding information storage means for outputting the second decoded word and the second code length respectively receive inputs of said 2nd to n-th data sequences whose leading bit corresponds to a bit position shifted bit by bit from a bit position shifted by a minimum code length of said Huffman code from the leading bit of said Huffman code data sequence output from said leading bit position determination means.

According to another aspect of the invention, a Huffman code decoding circuit comprises:

leading bit position determination means for determining a leading bit position of a Huffman code to be taken out of a Human code data sequence to take in a given number of bits starting at said determined leading bit position of said Huffman code data sequence;

first decoding information storage means for inputting said Huffman code data sequence output from said leading bit position determination means as a first data sequence to output a first decoded word and a first code length corresponding to said first data sequence applied as an address;

a plurality of 2nd to n-th decoding information storage means for respectively inputting 2nd to n-th data sequences each composed of a predetermined number of bits starting at a different bit position of said Huffman code data sequence output from said leading bit position determination means to output a decoded word and a code length corresponding to the 2nd to n-th data sequences applied as addresses; and selection means for selecting one of the outputs of said 2nd to n-th decoding information storage means in response to the first code length output by said first decoding information storage means as a select signal to output a second decoded word and a second code length, wherein said second code length output from said selection means is supplied to said leading bit position determination means and said leading bit position determination means determines a leading bit position of a Huffman code data sequence to be taken in based on said second code length, and when receiving an input of a data sequence other than those corresponding to decoded words, said 2nd to n-th decoding information storage means output the same code length as the first code length output from said first decoding information storage means as a second code length while outputting a control signal indicating whether said second decoded word is valid or invalid.

In the preferred construction, when a second decoded word corresponding to said 2nd to n-th data sequences exists, said 2nd to n-th decoding information storage means store a sum of a code length of the second decoded word and said first code length as said second code length.

In the above-mentioned construction, the 2nd to n-th data sequences are a part of a Huffman code corresponding to a decoded word, said 2nd to n-th decoding information storage means output a control signal indicative of invalidity of the decoded word while outputting said first code length as said second code length.

Also, the 2nd to n-th decoding information storage means for outputting the second decoded word and the second code length respectively receive inputs of said 2nd to n-th data sequences whose leading bit corresponds to a bit position shifted bit by bit from the leading bit of said first data sequence output from said leading bit position determination means, and said 1st to n-th data sequences input to said 1st to n-th decoding information storage means are of the number of bits decremented bit by bit.

In the above-mentioned construction, further comprises output means for inputting said second decoded word and said control signal output from said selection means to output said second decoded word when said control signal indicates validity and inhibit the output of said second decoded word when said control signal indicates invalidity.

In the above-mentioned construction, the 2nd to n-th decoding information storage means for outputting the second decoded word and the second code length respectively receive inputs of said 2nd to n-th data sequences whose leading bit corresponds to a bit position shifted bit by bit from a bit position shifted by a minimum code length of said Huffman code from the leading bit of said first data sequence output from said leading bit position determination means, and said 1st to n-th data sequences input to said 1st to n-th decoding information storage means are of the number of bits decremented bit by bit.

These and other objects, features and advantages of the present invention will become more apparent from the following detailed description of the present invention.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 2 is a diagram showing the details of an arrangement of a decoding table provided in the first embodiment.

FIG. 3 is a diagram showing the details of an arrangement of a decoding table provided in the first embodiment.

FIG. 4 is a diagram showing the details of an arrangement of a decoding table provided in the first embodiment.

FIG. 5 is a diagram showing the details of an arrangement of a decoding table provided in the first embodiment.

FIG. 8 is a diagram showing the details of an arrangement of a decoding table provided in the third embodiment.

FIG. 9 is a diagram showing the details of an arrangement of a decoding table provided in the third embodiment.

FIG. 10 is a diagram showing the details of an arrangement of a decoding table provided in the third embodiment.

FIG. 11 is a diagram showing the details of an arrangement of a decoding table provided in the third embodiment.

FIG. 15 is an explanatory diagram showing the principle of Huffman coding.

FIG. 16 is a diagram showing the details of an arrangement of a decoding table provided in the conventional circuit illustrated in FIG. 13.

FIG. 17 is a diagram showing the details of an arrangement of a decoding table provided in the conventional circuit illustrated in FIG. 14.

DESCRIPTION OF THE PREFERRED EMBODIMENT

Figure 1:
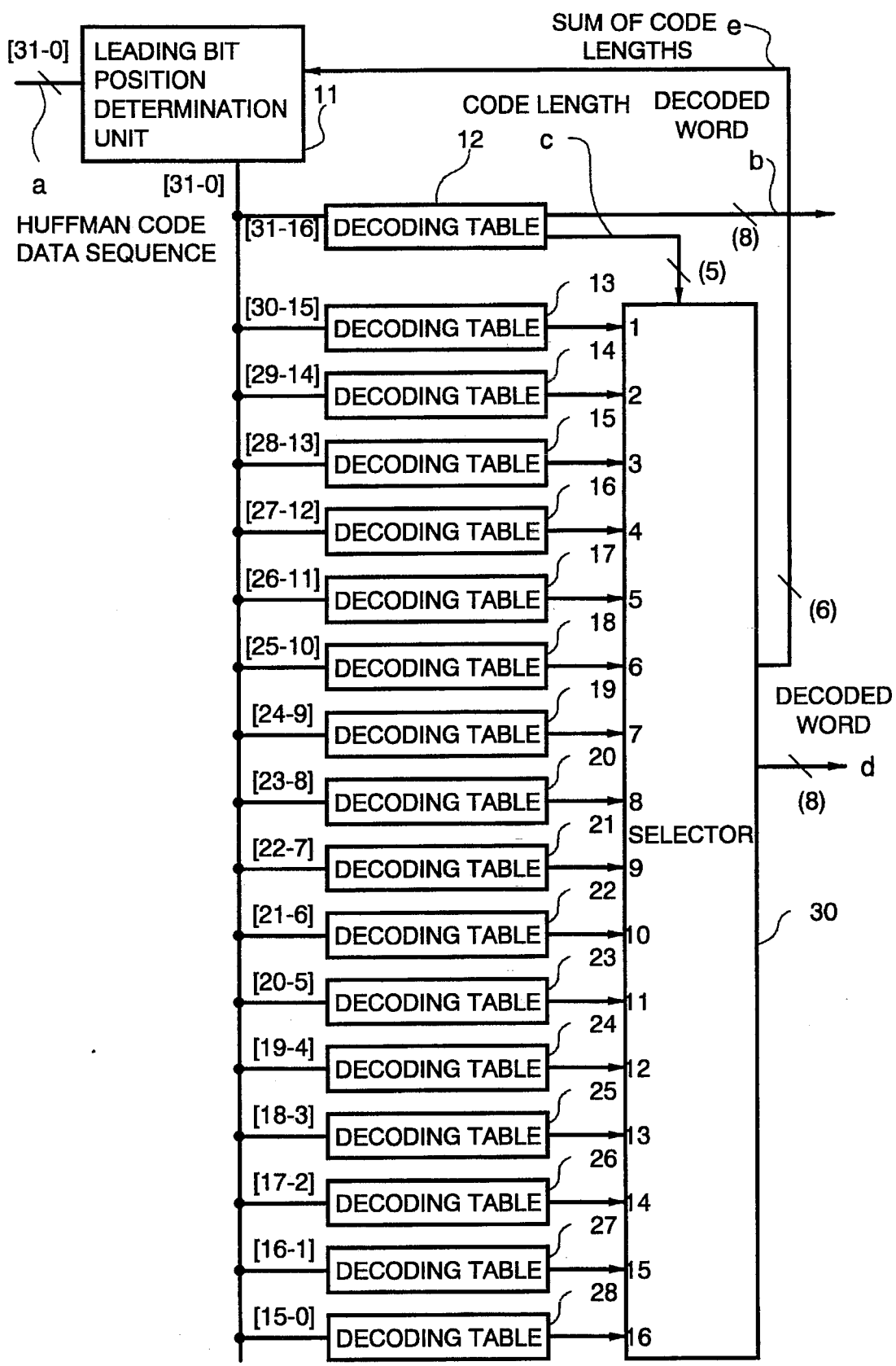
FIG. 1 is a block diagram showing an arrangement of a Huffman code decoding circuit according to a first embodiment of the present invention.

Preferred embodiments of the present invention will be described in detail with reference to accompanying drawings. FIG. 1 is a block diagram showing an arrangement of a Huffman code decoding circuit according to a first embodiment of the present invention. Herein, a maximum code length of a Huffman code is assumed to be 16 bits. The Huffman code data sequence [31-0] in the figure represents 32 bits of a Huffman code data sequence, and the most significant bit (bit number 31) is taken as a leading bit.

As shown in FIG. 1, the Huffman code decoding circuit according to the first embodiment comprises a leading bit position determination unit 11 for determining a leading bit of a Huffman code out of an applied Huffman code data sequence "a", a decoding table 12 for inputting 16 bits starting with a leading bit of a Huffman code determined by the leading bit position determination unit 11, a decoding table 13 for inputting 16 bits starting with a 2nd bit of a Huffman code, decoding tables 14–28 for inputting 16-bit data starting with an n-th bit ($3 \leq n \leq 17$, counting from a leading bit) of a Huffman code, and a selector 30 for selecting and outputting one of data output from the decoding tables 13–28 in response to a code length "c" as a select signal, which is an output of the decoding table 12. The decoding tables 12–28 are implemented, for example, by a ROM (Read Only Memory).

The leading bit position determination unit 11 determines a leading bit position of a Huffman code data sequence "a" to be output next based on a received sum of code lengths, "e". Since the received sum of code lengths, "e", indicates that decoding is completed up to a bit position represented by the sum "e", the leading bit position determination unit 11 sets a bit position subsequent to the bit position represented by the sum "e" as a leading bit position of a Huffman code data sequence "a" to be output next.

The leading bit position determination unit 11 is implemented by applying a shift circuit for shifting a Huffman code data sequence "a" by the number of bits represented by a received sum of code lengths.

The selector 30 selects output data of the decoding table 13 when the code length "c" output from the decoding table 12 is "1" and selects output data of the decoding table 14 when the code length "c" output from the decoding table 12 is "2" (output data of the other decoding tables 15–28 are also selected in the same manner). The selector 30 selects and outputs, as a decoded word "d", an output of one of the decoding tables 13–28 located at an input port corresponding to a value (1–16) of the code length "c" output from the decoding table 12. The selector 30 also outputs the sum of code lengths, "e", to the leading bit position determination unit 11.

As shown in FIG. 2, the decoding table 12 stores a decoded word (8 bits) and a code length (5 bits) corresponding to a Huffman code input as an address.

The decoding tables 13 to 28 each store a decoded word of 8 bits and a sum of code lengths of two decoded words, of 6 bits, corresponding to a Huffman code applied as an address.

A sum of code lengths stored in each decoding table n ($13 \leq n \leq 28$) takes a value of an addition of a code length of a decoded word obtained by the decoding table n and an input port position of the selector 30 connected to the output of the decoding table n, that is, a value of a select signal 1 to 16 (i.e. a code length output from the decoding table 12) corresponding to the table n.

In FIG. 1, the code length is set to be 5 bits long and the sum of code lengths is set to be 6 bits long because a code length, which is an output of the decoding table 12, is to take a value of 1 to 16 (i.e. 5 bits long), and a maximum sum of code lengths is to be 32 (i.e. 6 bits long).

FIGS. 2 to 5 show one example of setting in the decoding tables 12, 13, 16 and 23 illustrated in FIG. 1, respectively. In these figures, a Huffman code for a coded word "A" is assumed to be "0101" and that for a coded word "B" to be "0110101".

The decoding table 12 outputs the decoded word "A" and the code length "4" in response to an input of "0101x . . . " as shown in FIG. 2. In response to an input of "0110101x . . . ", the table 12 is set to output the decoded word "B" and the code length "7" beforehand.

The decoding table 13, as shown in FIG. 3, stores a decoded word and a sum of code lengths. Stored as a sum of code lengths is a value of the addition of "1" to a code length of a decoded word obtained by the decoding table 13 to meet a case in which a code length of a decoded word obtained by the decoding table 12 is "1" (a select signal of the selector 30 is "1"). In other words, the decoding table 13 is set to output the decoded word "A" and the sum of the code lengths, "5" (=4+1), when "0101x . . . " is applied.

The decoding table 16, as shown in FIG. 4, stores a code word and a sum of code lengths. Set as a sum of code lengths is a value of the addition of "4" to a code length of a decoded word obtained by the decoding table 16 (=code length+4) to meet a case in which a code length of a decoded word obtained by the decoding table 12 is "4". When receiving an input of "0101x . . . ", for example, the decoding table 16 outputs the decoded word "A" and the sum of the code lengths, "8" (=4+4).

Other decoding tables similarly store a decoded word and a sum of code lengths corresponding an address input. The leading bit position determination unit 11 takes a leading bit of an applied Huffman code data sequence "a" (32 bits) as its initial value.

When a Huffman code provided for the decoded word "A" is "0101", the decoded word "A" and the code length "4" are set for all address inputs "01010 . . . 0" to "01011 . . . 1" in each of the decoding tables. In other words, when 4 higher-order bits of 16 bits are "0101", the decoded word "A" and the code length "4" are set irrespective of values of the remaining 5th to 16th bits.

Operation of the present embodiment will be described with reference to a specific example of a Huffman code data sequence "a". Herein, it is assumed that a Huffman code data sequence "01010110101001001 . . . " arrives.

The leading bit position determination unit 11 receives an input of 32 bits "01010110101001001 . . . " from the top. Since the initial value of the leading bit position determination unit 11 corresponds to a leading bit of an applied 32-bit Huffman code data sequence, the unit 11 outputs 32 bits starting with the leading bit of the received Huffman code data sequence, i.e. "01010110101001001 . . . "

As shown in FIG. 1, each of the decoding tables 12–28 receives an input of 16 bits out of a 32-bit Huffman code data sequence. Numerals in parentheses denote bit numbers of 16 bits input to each decoding table. Applied to the decoding table 12 are 16 bits starting at the bit No. 31 (a leading bit of the 32-bit Huffman code data sequence) to the bit No. 16. Applied to the decoding table 13 are 16 bits starting at the bit No. 30 and ending at the bit No. 15.

In the same manner, 16 bits starting at a bit number decremented bit by bit are applied to the decoding tables 14 to 28.

In other words 16 bits from the leading bit of the Huffman code data sequence, i.e. "0101011010100100", are input to the decoding table 12.

The decoding table 12, which is set to output the decoded word "A" and the code length "4" in response to an input of "0101x . . . " as shown in FIG. 2, then outputs the decoded word "A" and the code length "4". The code length "4", which is the output of the decoding table 12, is sent as a select signal to the selector 30.

On the other hand, each of the decoding tables 13 to 28 also receives an input of 16 bits starting at a predetermined bit position of the Huffman code data sequence and outputs data (a decoded word and a sum of code lengths) corresponding to the input to the selector 30.

The decoding table 16, for example, receives an input of 16-bit data starting at the 5th bit (bit No. 27), i.e.

"0110101001001 . . . " The decoding table 16, which is set to output the decoded word "B" and the sum of code lengths, "11" (=4+7), in response to an input of "0110101x . . . " as shown in FIG. 4, then outputs the decoded word "B" and the sum of code lengths, "11".

The selector 30 receives an input of the code length "4" of the decoding table 12 as a select signal. In this case, the selector 30 selects the output data of the decoding table 16 and outputs the decoded word "B" and the sum of code lengths, "11". Decoded words and sums of code lengths from the other decoding tables are not selected by the selector 30 and not output accordingly.

Then, the sum of code lengths, "11", is sent to the leading bit position determination unit 11, which unit determines a leading bit position of a Huffman code data sequence to be output next based on the received sum "11". In this case, since the sum of 11 indicates that decoding is completed up to the 11th bit from the top, the leading bit position determination unit 11 sets the 12th bit position subsequent to the 11th bit as a leading bit position of a Huffman code data sequence to be output next. More specifically, the leading bit position determination unit 11 sets the 12th bit from the top of the last 32-bit Huffman code data sequence "01010110101001001 . . . " as a leading bit of a next Huffman code and newly outputs data of 32 bits starting with the 12th bit, i.e. "001001 . . . 1".

Repetition of the foregoing operation in the first embodiment results in decoding of two words at a time out of a Huffman code data sequence, which leads to high-speed decoding processing.

As described in the foregoing, the Huffman code decoding circuit according to the present invention can realize high-speed Huffman code decoding processing because of its capability of decoding two words at a time as well as allowing a signal path to be shorter than that of a convention circuit, which path is made up of a path from the leading bit position determination unit 11 to a decoding table and that from the decoding table to the leading bit position determination unit 11 through the selector 30.

In the present invention, storing beforehand a sum of a code length of a second decoded word and a code length of a first decoded word in a decoding table for outputting a second decoded word results in a simplified circuit arrangement for controlling a leading bit, which further leads to high-speed decoding processing. In the present invention, inputting Huffman code data to a plurality of decoding tables, with its leading bit position shifted by one bit from that of the preceding data, also contributes to simplification of a circuit arrangement and improvement of processing speed.

In the first embodiment shown in FIG. 1, a code length of a Huffman code is assumed to be "1" to "16". A total of 16 decoding tables 13 to 28, other than the decoding table 12, are accordingly provided to correspond to values of the respective code lengths.

When a minimum code length of a Huffman code is greater than "1", it is therefore possible to omit providing a decoding table corresponding to a select signal whose value not greater than the minimum code length.

Figure 6:
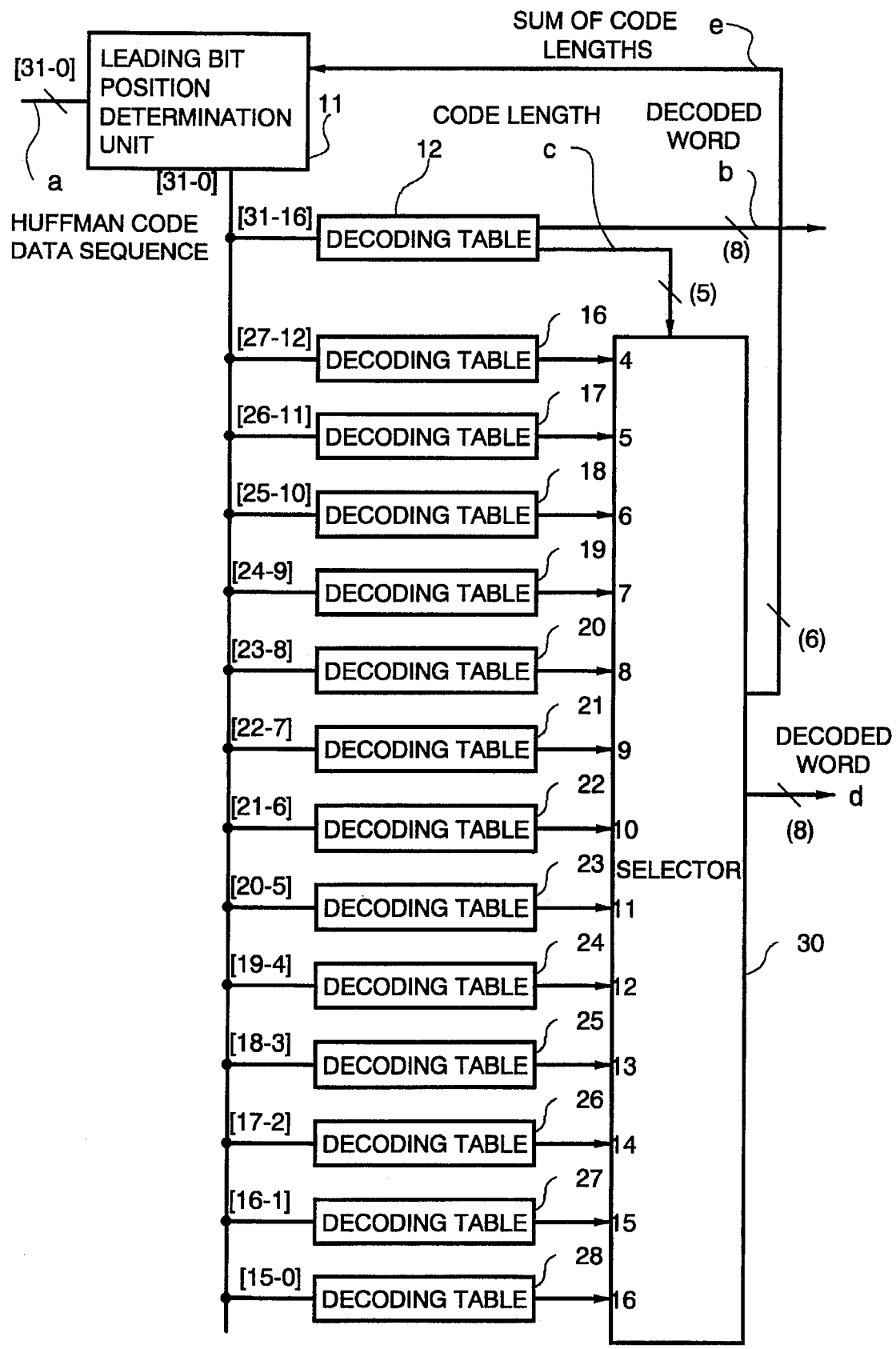
FIG. 6 is a block diagram showing an arrangement of a Huffman code decoding circuit according to a second embodiment of the present invention.

FIG. 6 shows a circuit arrangement of a second embodiment where a minimum code length of a Huffman code is set to be "4". In FIG. 6, the same reference numerals as those in FIG. 1 represent the same parts. In the second embodiment, the minimum code length of a Huffman code is set to be "4" and as a result, no code length less than or equal to "3" is output from the decoding table 12 as a select signal.

Therefore, decoding tables 13 to 15 shown in FIG. 1 are not provided in the second embodiment. This enables reduction of the size of the decoding table as a whole by the area of the decoding tables 13 to 15.

Figure 7:
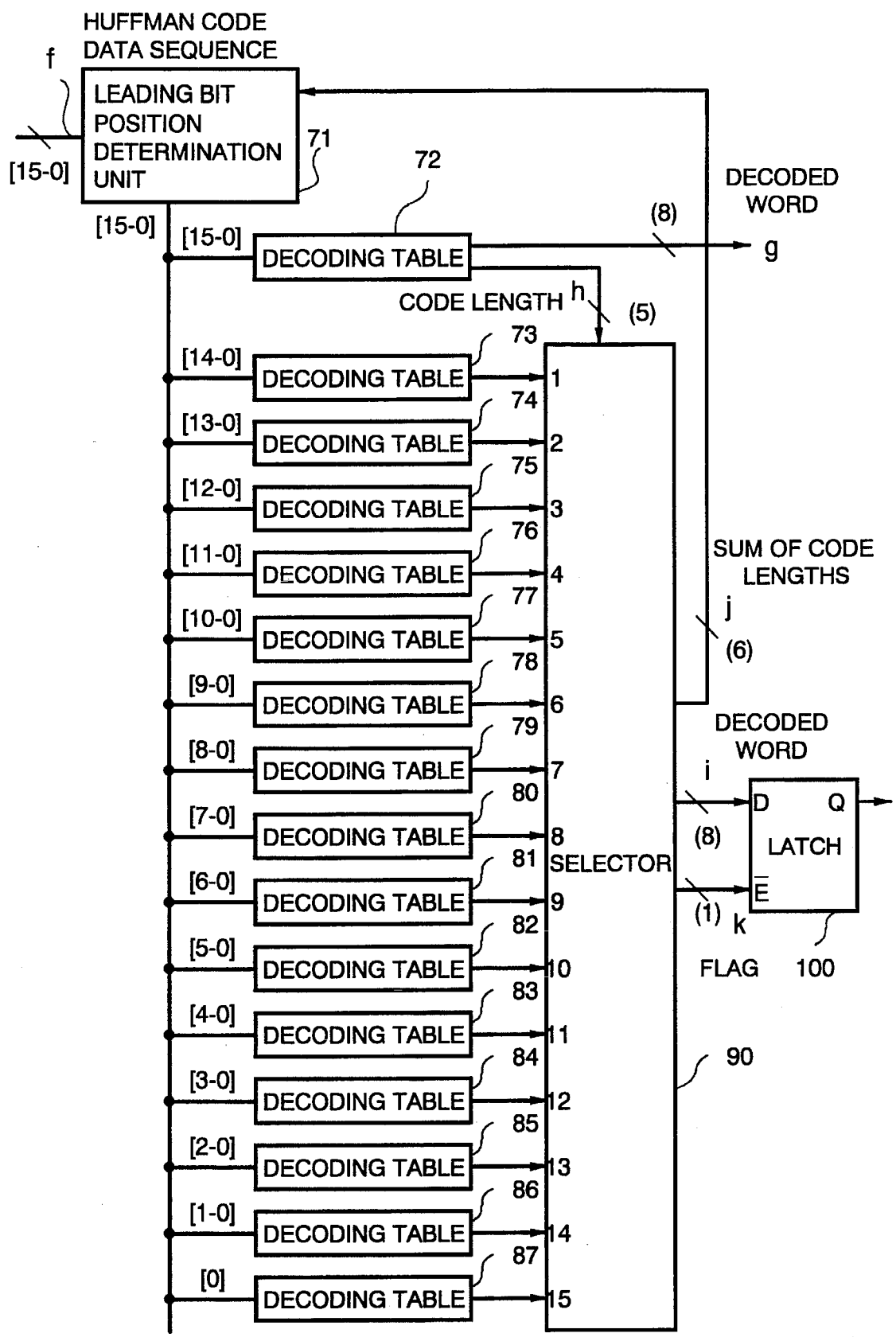
FIG. 7 is a block diagram showing an arrangement of a Huffman code decoding circuit according to a third embodiment of the present invention.

A third embodiment of the present invention will be descried with reference to FIG. 7. A Huffman code decoding circuit of the third embodiment further increases a decoding processing speed as compared with the first embodiment and is suitable for reducing the size of a decoding table. FIG. 7 is a block diagram of the Huffman code decoding circuit according to the third embodiment.

In the Huffman code decoding circuit of the third embodiment, a maximum code length of a Huffman code is set to be 16 bits. In the figure, the Huffman code data sequence f [15-0] represents 16 bits of a Huffman code data sequence, whose leading bit is set to be the bit No. 15, the most significant bit.

As illustrated in FIG. 7, the Huffman code decoding circuit of the present embodiment comprises a leading bit position determination unit 71 for determining a leading bit of a Huffman code out of a Huffman code data sequence "f", a decoding table 72 for receiving an input of 16 bits starting at a leading bit position of a Huffman code determined by the leading bit position determination unit 71, a decoding table 73 for receiving an input of 15 bits staring with a 2nd bit and ending with a 16th bit from the top, decoding tables 74 to 87 for receiving an input of data starting at a n-th ($3 \leq n \leq 16$) bit position and ending at a 16th bit position from the top of a Huffman code data sequence in the same manner, a selector 90 for selecting and outputting one of the outputs of the decoding tables 73 to 87 in response to a code length "h" output from the decoding table 72 as a select signal, a latch circuit 100 for permitting or inhibiting an output of a decoded word "i" based on a flag "k", which is a control signal output from the selector 90. The decoding tables 72 to 87 are implemented by an ROM (Read Only Memory), for example.

The leading bit position determination unit 71 determines a leading bit position of a Huffman code data sequence "f" to be output next based on the received sum of code lengths, "j". Since the received sum "j" indicates that decoding up to the bit position represented by "j" is completed, the leading bit position determination unit 71 sets a bit position subsequent to the bit position represented by the sum "j" as a leading bit position of a Huffman code data sequence "f" to be output next. The leading bit position determination unit 71 is implemented by applying a shift circuit for shifting a Huffman code data sequence "f" by the number of bits represented by the received sum of code lengths, "j".

The selector 90 selects output data of the decoding table 73 when the code length "h" as an output of the decoding table 72 is "1", and output data (a decoded word "i" and the sum of code lengths, "j", and a flag "k" ) of the decoding table 74 when the code length "h" is "2". In the same manner, the selector 90 selectively outputs output data (the decoded word "i", the sum of code lengths, "j", and the flag "k") of the decoding tables 75 to 87 according to a value of the code length "h". The selector also outputs the sum "j" to the leading bit position determination unit 71.

As shown in FIG. 8, the decoding table 72 stores a decoded word of 8 bits and a code length of 5 bits corresponding to Huffman code data applied as an address. As shown in FIGS. 9 to 11, the decoding tables 73 to 87 each store a decoded word of 8 bits and a sum of code lengths of two decoded words, of 8 bits, and a flag of 1 bit corresponding to Huffman code data applied as an address.

A sum of code lengths stored in each decoding table n (73≦n≦87) takes a value of an addition of a code length of a decoded word obtained by the decoding table n (73≦n≦87) and an input port position of the selector 90 connected to the output of the decoding table n, that is, a value of a select signal 1 to 15 (a code length of the decoding table 72) corresponding to the table n.

FIGS. 8 to 11 each show one example of setting of the decoding tables illustrated in FIG. 7. Set, for example, are "0101" as a Huffman code for the decoded word "A", "0110101" as that for the decoded word "B", "0111001011001" as that for the decoded word "C" and "1011010000" as that for the decoded word "D".

As shown in FIG. 8, the decoding table 72 is set to output the decoded word "A" and the code length "4" in response to an input of "0101x 1" the decoded word "B" and the code length "7" to "0110101x . . . ", the decoded word "C" and the code length "13" to "0111001011001x . . . " and the decoded word "D" and the code length "10" to "1011010000x . . . "

In the decoding tables 73 to 87, a decoded word of 8 bits, a sum of 6 bits of code lengths and a flag of 1 bit as a control signal are set as described below.

As shown in FIG. 9, the decoding table 73, for example, outputs the decoded word "A", the sum of code lengths, "5" (=4+1), and a flag "0" in response to an input of "0101x . . . ", the decoded word "B" the sum of code lengths, "8" (=7+1), and the flag "0" to "0110101x . . . ", the decoded word "C", the sum of code lengths, "14" (=13+1), and the flag "0" to an input of "0111001011001x . . . " and the decoded word "D", the sum of code lengths, "11" (=10+1), and the flag "0" to an input of "1011010000x . . . "

As shown in FIG. 11, when receiving an input of "010", "011" or "101", for example, as a part of a Huffman code corresponding to a decoded word, the decoding table 85 outputs the code length "13" and the flag "1" because only a part of the Huffman code corresponding to the decoded word is applied as an address.

Although in FIG. 11 no decoded word is indicated corresponding to or less than 3 bits, it is apparent that when a certain decoded word is provided corresponding to the 3-bit Huffman code "010", for example, the decoding table 85 is set to output the corresponding decoded word and the sum of code lengths, i.e. "16" (=3+13), with the 3-bit Huffman code "010" as an address. This is also the case with the decoding tables 86 and 87.

In the decoding table 85, the code length is set to be "13" in order to send a code length of a decoded word obtained by the decoding table 72 to the leading bit position determination unit 71 when there is no corresponding decoded word (in a case of flag "1"). The reason that "13" is set in the table 85 is because the selector 90 selects the output of the decoding table 85 when a code length corresponding to a decoded word output from the decoding table 72 is "13".

As described in the foregoing, the decoding tables 73 to 87 are set to output a sum of code lengths as a code length of a decoded word determined by the decoding table 72 and the flag "1" when only a part of a Huffman code corresponding to a decoded word is input as an address. In the other decoding tables, a decoded word, a code length and a flag are set corresponding to an address input in the same manner.

The initial value of the leading bit position determination unit 71 is assumed to be a leading position bit (bit No. 16) of 16 bits of an applied Huffman code data sequence.

When a Huffman code corresponding to the decoded word "A" is "0101", the decoded word "A" and the code length "4" are set for all address inputs "01010 . . . 0" to "01011 . . . 1" in each decoding table. In other words, when four higher-order bits are "0101", the decoded word "A" and the code length "4" are set irrespective of the values of 5th and the following bits.

As described in the foregoing, in the Huffman code decoding circuit according to the third embodiment, the number of bits applied to the decoding tables 72 to 87 is 16 bits, 15 bits, 14 bits, . . . , 1 bit, respectively. This arrangement allows the size of the decoding table to be smaller as a whole than that of the first embodiment. Because addresses input to all the decoding tables are of 16 bits, the first embodiment has a decoding table of a larger size as a whole than that in the arrangement according to the third embodiment.

Operation of the present embodiment will be described with reference to a specific example of a Huffman code data sequence in the following. It is assumed herein that a Huffman code data sequence "0101011010101110010110011011010000 . . . " arrives.

The leading bit position determination unit 71 receives an input of 16 bits starting with a leading bit of the sequence, i.e. "0101011010101110". The leading bit position determination unit 71, in which the initial value of a leading bit is set to be a leading bit of a 16-bit Huffman code data sequence, outputs 16 bits from the top, i.e. "0101011010101110".

The decoding table 72 is applied data of 16 bits from the top, i.e. "0101011010101110".

The decoding table 72, which is set to output the decoded word "A" and the code length "4" in response to an input of "0101x . . . " as shown in FIG. 8, then outputs the decoded word "A" and the code length "4". The code length "4", which is an output of the decoding table 72, is supplied to the selector 90 as a select signal.

On the other hand, each of the decoding tables 73 to 87 also receives an input of Huffman code data as shown in FIG. 7 and outputs data (decoded word, sum of code lengths and flag) corresponding to its input to the selector 90.

The decoding table 76, for example, is applied 12-bit data "011010101110", which are the 5th to 16th bits from the top. The decoding table 76, which is set to output the decoded word "B" and the sum of code lengths, "11", in response to an input of "0110101x . . . " as shown in FIG. 10, then outputs the decoded word "B", the sum "11" and the flag "0".

With the code length "4" of the decoding table 72 as a select signal, the selector 90 selects data output from the decoding table 76 in this case. As a result, the selector 90 outputs the decoded word "B", the sum of code lengths, "11", and the flag "0". The sum "11" is supplied to the leading bit position determination unit 71.

The decoded word "B" and the flag "0" output from the selector 90 are input to the latch circuit 100. The latch circuit 100 outputs the received decoded word "B" in response to the flag "0".

As a result, "A" and "B" are obtained as a decoded word "g" from the decoding table 72 and a decoded word "i" from the decoding table 76, respectively, that is, two decoded words are obtained at a time.

Then, the sum "11" is sent to the leading bit position determination unit 71, which unit determines a leading bit position of a Huffman code data sequence to be output next based on the received sum of code lengths, "11". In this case, since the sum "11" indicates that decoding of the data up to the 11th bit position from the top is completed, the leading bit position determination unit 71 determines the 12th bit from the leading bit of the last 16-bit Huffman code data sequence "0101011010101110" as a leading bit position of the next Huffman code and outputs 16 bits starting at the newly determined leading bit position, i.e., "0111001011001101".

The decoding table 72, which is set to output the decoded word "C" and the code length "13" in response to an input of "01110001011001x . . . " as shown in FIG. 8, then outputs the decoded word "C" and the code length "13". The code length "13" is supplied as a select signal to the selector 90.

On the other hand, each of the decoding tables 73 to 87 also receives an input of Huffman code data and outputs corresponding data to the selector 90, with each of the Huffman code data as an address.

The decoding table 85, for example, is applied 3-bit data "010" starting with the 14th bit to the 16th bit from the top. The decoding table 85, which is set to output the code length "13" and the flag "1" in response to an input of "010" as shown in FIG. 11, then outputs the code length "13" and the flag "1".

With the code length "13" of the decoding table 72 as a select signal, the selector 90 in this case selects the output of the decoding table 85 to output the code length "13" and the flag "1".

The flag "1" output from the selector 90 is input to the latch circuit 100. The latch circuit 100 outputs nothing because of the flag "1".

In this case, the decoded word is output only from the decoding table 72, that is, two decoded words are not be output at a time.

The code length "13" output from the selector 90 is supplied to the leading bit position determination unit 71, which unit determines the 14th bit from the top of the last 16-bit data "0111001011001101" as a leading bit of the next Huffman code and outputs data of 16 bits starting at the newly set leading position, i.e. "1011010000 . . . "

Operation will be repeated in the same manner to sequentially decode an applied Huffman code data sequence in this embodiment.

In the third embodiment, when the decoding tables 73 to 87 for outputting a second decoded word receive an input of a part of a Huffman code representing a decoded word as an address, the flag "1" is output to execute decoding by using only the decoding table 72. As compared with the first embodiment, although two decoded words are not always output at a time, the third embodiment can realize the speed-up of decoding processing more satisfactorily than by a conventional circuit for outputting decoded words one by one. In addition, the third embodiment allows reduction of the scale of a circuit, that is, the size of a decoding table.

The third embodiment shown in FIG. 7 is described on the assumption that a code length of a Huffman code is "1" to "16". A total of 15 decoding tables 73 to 87, other than the decoding table 72, are accordingly provided to correspond to values of the respective code lengths.

As a result, when a minimum code length of a Huffman code is greater than "1", it is possible to avoid providing a decoding table corresponding to a select signal value not greater than the minimum code length.

Figure 12:
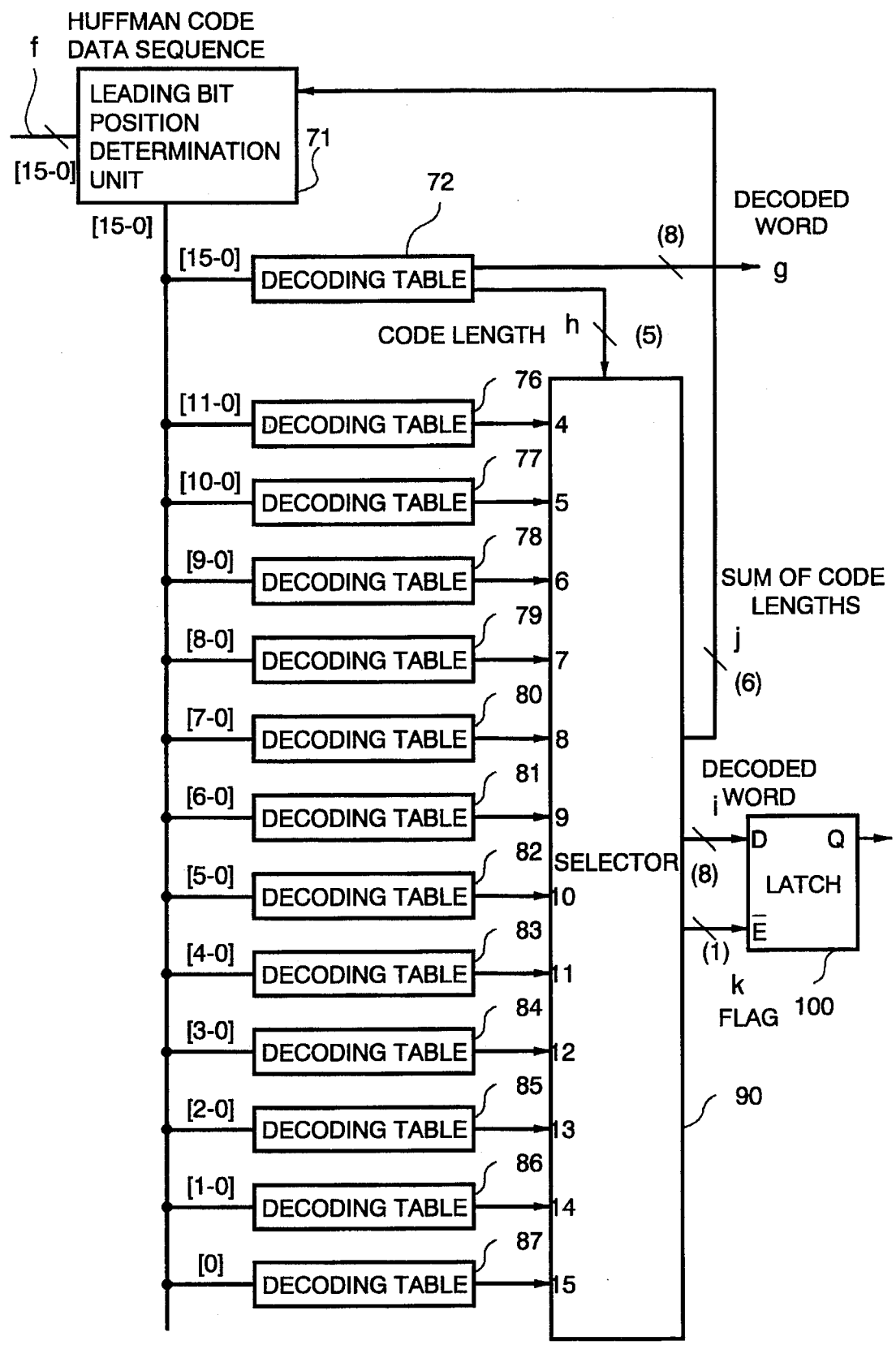
FIG. 12 is a block diagram showing an arrangement of a Huffman code decoding circuit according to a fourth embodiment.
Figure 13:
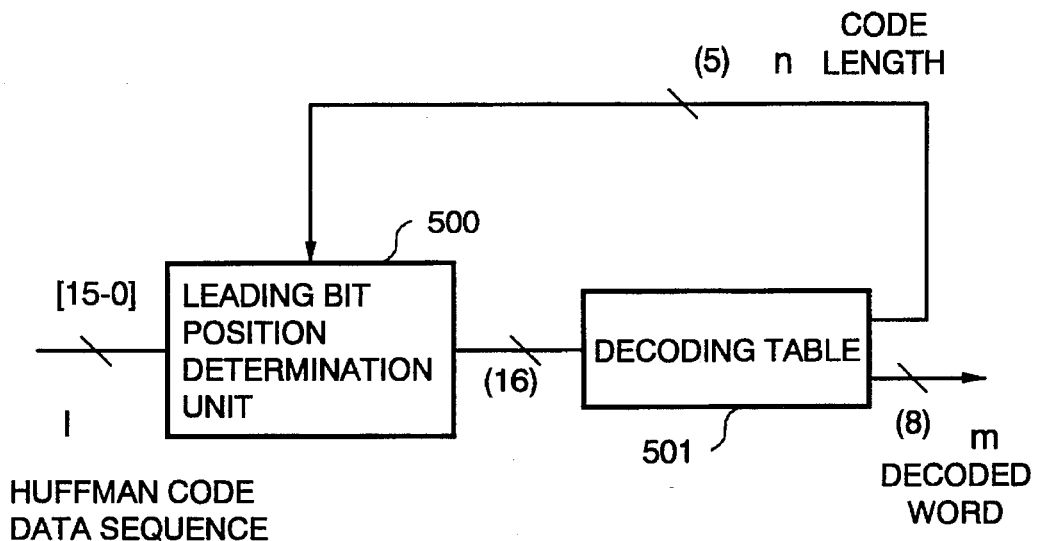
FIG. 13 is a block diagram showing one example of an arrangement of a conventional Huffman code decoding circuit.
Figure 14:
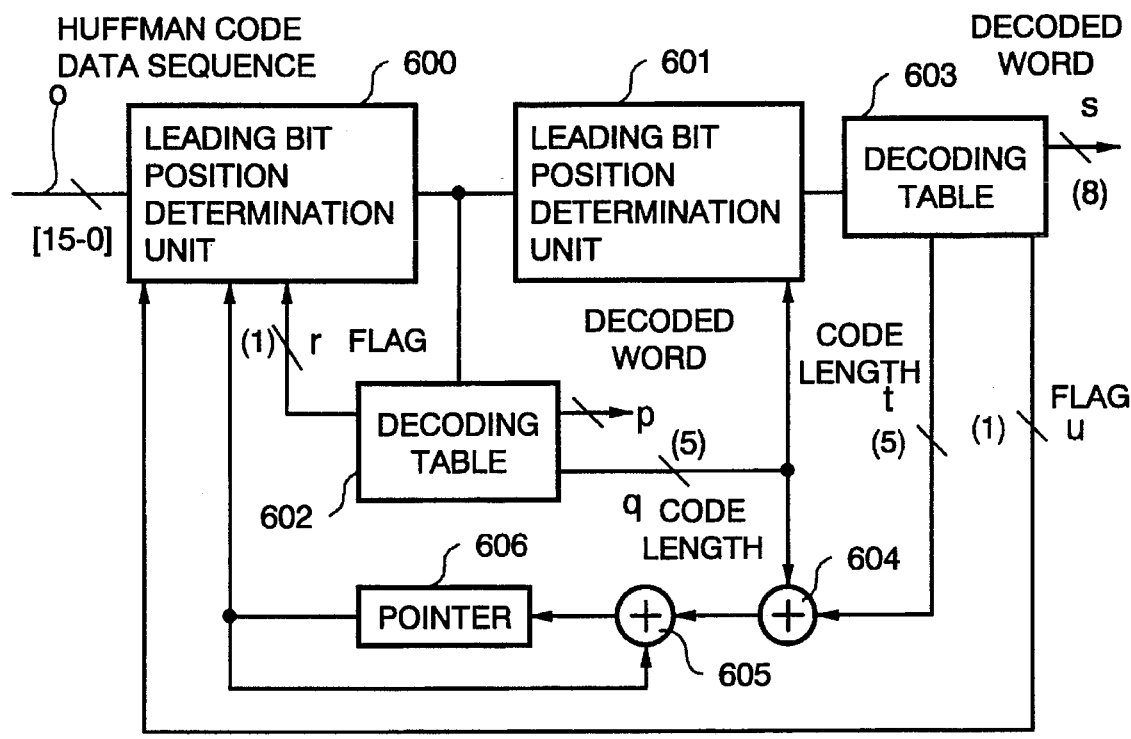
FIG. 14 is a block diagram showing another example of an arrangement of a conventional Huffman code decoding circuit.
Figure 12:
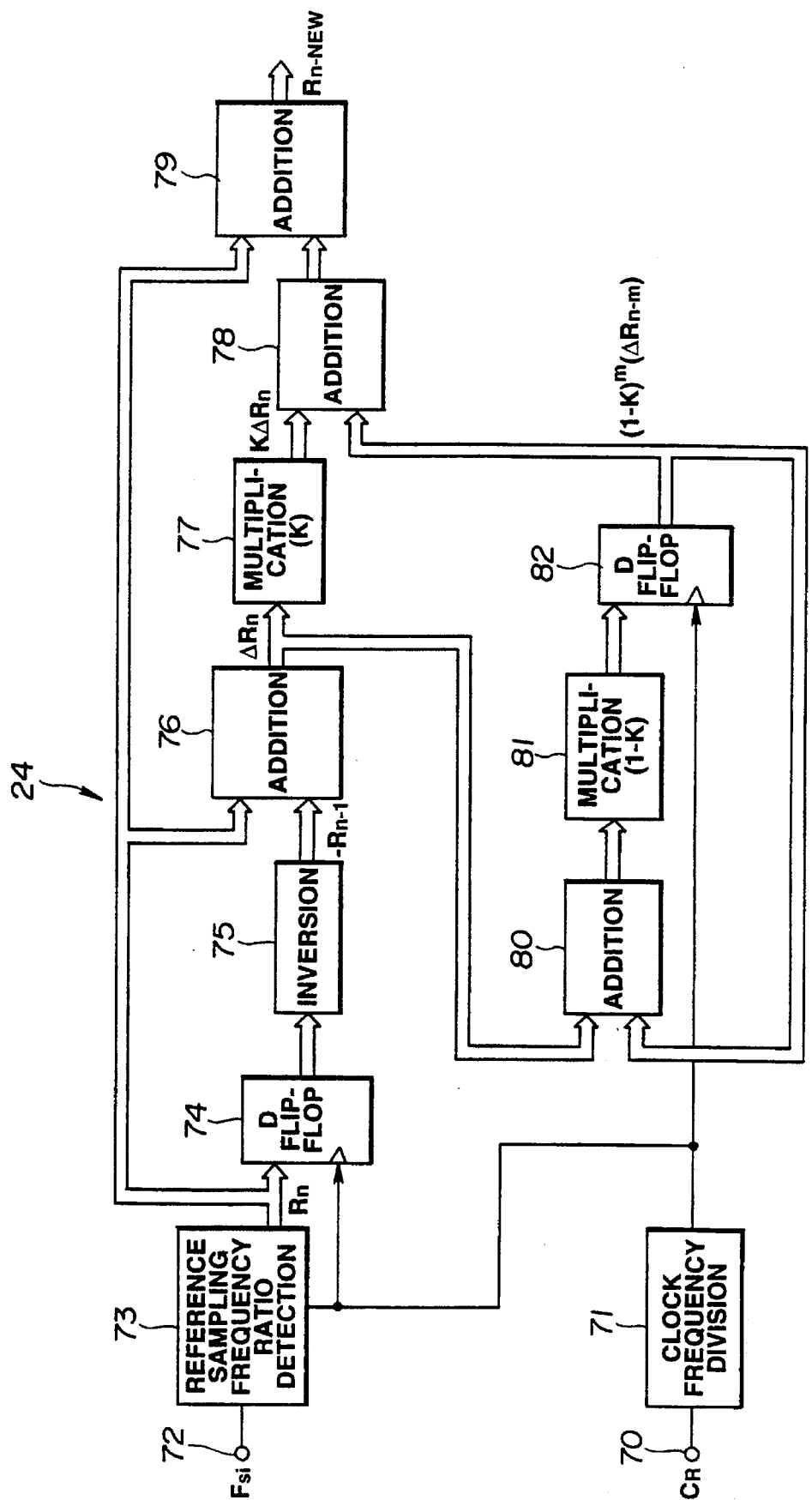

FIG. 12 shows a circuit arrangement of a fourth embodiment where a minimum code length of a Huffman code is set to be "4". In FIG. 12, the same reference numerals as those in FIG. 7 represent the same parts. In this fourth embodiment, since the minimum code length of a Huffman code is set to be "4", no code length less than or equal to "3" is output as a select signal from the decoding table 72. As a result, the circuit of the fourth embodiment is structured without the decoding tables 73 to 75 shown in FIG. 7. This arrangement enables reduction in the size of the decoding table as a whole by the area of the omitted decoding tables 73 to 75.

Although the present invention has been described with respect to the preferred embodiments in the foregoing, arrangements of the decoding tables shown in FIGS. 2 to 5 and FIGS. 8 to 11 are some examples for better understanding of the present invention and it will be therefore understood that the present invention is not limited thereto.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A Huffman code decoding circuit comprising:

leading bit position determination means for determining a leading bit position of a Huffman code to be taken out of a Huffman code data sequence to take in a given number of bits starting at said determined leading bit position of said Huffman code data sequence;

first decoding information storage means for inputting a first data sequence composed of a predetermined number of bits starting with the leading bit of said Huffman code data sequence output from said leading bit position determination means to output a first decoded word and a first code length corresponding to said first data sequence applied as an address;

a plurality of 2nd to n-th decoding information storage means for respectively inputting 2nd to n-th data sequences each composed of a predetermined number of bits starting at a different bit position different of said Huffman code data sequence output from said leading bit position determination means to output a decoded word and a code length corresponding to the 2nd to n-th data sequences applied as addresses; and selection means for selecting one of the outputs of said 2nd to n-th decoding information storage means in response to the first code length output by said first decoding information storage means as a select signal to output a second decoded word and a second code length;

wherein said second code length output from said selection means is supplied to said leading bit position determination means and said leading bit position determination means determines a leading bit position of a Huffman code data sequence to be taken in based on said second code length.

2. The Huffman code decoding circuit as set forth in claim 1, wherein said 2nd to n-th decoding information storage means store a sum of a code length of the second decoded word and said first code length as said second code length.

3. The Huffman code decoding circuit as set forth in claim 1, wherein said 1st to n-th data sequences input to said 1st to n-th decoding information storage means are of the same number of bits.

4. The Huffman code decoding circuit as set forth in claim 1, wherein said 2nd to n-th decoding information storage means for outputting the second decoded word and the second code length respectively receive inputs of said 2nd to n-th data sequences whose leading bit corresponds to a bit position shifted bit by bit in said Huffman code data sequence output from said leading bit position determination means.

5. The Huffman code decoding circuit as set forth in claim 1, wherein said 1st to n-th data sequences input to said 1st to n-th decoding information storage means are of the same number of bits, and said 2nd to n-th decoding information storage means for outputting the second decoded word and the second code length respectively receive inputs of said 2nd to n-th data sequences whose leading bit corresponds to a bit position shifted bit by bit from the leading bit position of said Huffman code data sequence output from said leading bit position determination means.

6. The Huffman code decoding circuit as set forth in claim 1, wherein said 1st to n-th data sequences input to said 1st to n-th decoding information storage means are of the same number of bits, and said 2nd to n-th decoding information storage means for outputting the second decoded word and the second code length respectively receive inputs of said 2nd to n-th data sequences whose leading bit corresponds to a bit position shifted bit by bit from a bit position shifted by a minimum code length of said Huffman code from the leading bit of said Huffman code data sequence output from said leading bit position determination means.

7. A Huffman code decoding circuit comprising:

leading bit position determination means for determining a leading bit position of a Huffman code to be taken out of a Human code data sequence to take in a given number of bits starting at said determined leading bit position of said Huffman code data sequence;

first decoding information storage means for inputting said Huffman code data sequence output from said leading bit position determination means as a first data sequence to output a first decoded word and a first code length corresponding to said first data sequence applied as an address;

a plurality of 2nd to n-th decoding information storage means for respectively inputting 2nd to n-th data sequences each composed of a predetermined number of bits starting at a different bit position of said Huffman code data sequence output from said leading bit position determination means to output a decoded word and a code length corresponding to the 2nd to n-th data sequences applied as addresses; and selection means for selecting one of the outputs of said 2nd to n-th decoding information storage means in response to the first code length output by said first decoding information storage means as a select signal to output a second decoded word and a second code length, wherein said second code length output from said selection means is supplied to said leading bit position determination means and said leading bit position determination means determines a leading bit position of a Huffman code data sequence to be taken in based on said second code length, and when receiving an input of a data sequence other than those corresponding to decoded words, said 2nd to n-th decoding information storage means output the same code length as the first code length output from said first decoding information storage means as a second code length while outputting a control signal indicating whether said second decoded word is valid or invalid.

8. The Huffman code decoding circuit as set forth in claim 7, wherein when a second decoded word corresponding to said 2nd to n-th data sequences exists, said 2nd to n-th decoding information storage means store a sum of a code length of the second decoded word and said first code length as said second code length.

9. The Huffman code decoding circuit as set forth in claim 7, wherein when said 2nd to n-th data sequences are a part of a Huffman code corresponding to a decoded word, said 2nd to n-th decoding information storage means output a control signal indicative of invalidity of the decoded word while outputting said first code length as said second code length.

10. The Huffman code decoding circuit as set forth in claim 7, wherein said 2nd to n-th decoding information storage means for outputting the second decoded word and the second code length respectively receive inputs of said 2nd to n-th data sequences whose leading bit corresponds to a bit position shifted bit by bit from the leading bit of said first data sequence output from said leading bit position determination means, and said 1st to n-th data sequences input to said 1st to n-th decoding information storage means are of the number of bits decremented bit by bit.

11. The Huffman code decoding circuit as set forth in claim 7, further comprising output means for inputting said second decoded word and said control signal output from said selection means to output said second decoded word when said control signal indicates validity and inhibit the output of said second decoded word when said control signal indicates invalidity.

12. The Huffman code decoding circuit as set forth in claim 7, wherein said 2nd to n-th decoding information storage means for outputting the second decoded word and the second code length respectively receive inputs of said 2nd to n-th data sequences whose leading bit corresponds to a bit position shifted bit by bit from a bit position shifted by a minimum code length of said Huffman code from the leading bit of said first data sequence output from said leading bit position determination means, and said 1st to n-th data sequences input to said 1st to n-th decoding information storage means are of the number of bits decremented bit by bit.

* * * * *